United States Patent
Kim

(10) Patent No.: US 6,489,651 B1
(45) Date of Patent: Dec. 3, 2002

(54) MOS TRANSISTOR THAT INHIBITS PUNCHTHROUGH

(75) Inventor: Sang Yong Kim, Kyungki-do (KR)

(73) Assignees: Anam Semiconductor Inc., Seoul (KR); Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/595,851

(22) Filed: Jun. 16, 2000

Related U.S. Application Data

(62) Division of application No. 09/223,236, filed on Dec. 30, 1998, now Pat. No. 6,200,841.

(30) Foreign Application Priority Data

Dec. 30, 1997 (KR) ............................................. 97-78391
Dec. 30, 1997 (KR) ............................................. 97-78392

(51) Int. Cl.[7] ............................................. H01L 29/78
(52) U.S. Cl. ....................... 257/327; 438/299; 257/332
(58) Field of Search ................................. 438/197, 424, 438/429, 207, 218, 221, 225, 294, 296, 297, 299; 257/330, 362, 497, 344, 336, 408, 510, 900

(56) References Cited

U.S. PATENT DOCUMENTS

| | | | | |
|---|---|---|---|---|
| 4,523,213 A | * | 6/1985 | Konaka et al. | |
| 5,453,635 A | | 9/1995 | Hsu et al. | 257/336 |
| 5,472,894 A | * | 12/1995 | Hsu | 437/44 |
| 5,773,343 A | * | 6/1998 | Lee et al. | 438/259 |
| 5,817,558 A | * | 10/1998 | Wu | 438/291 |
| 5,843,820 A | * | 12/1998 | Lu | 438/243 |
| 5,864,159 A | * | 1/1999 | Takahashi | 257/330 |
| 5,943,581 A | * | 8/1999 | Lu | 438/386 |
| 5,962,894 A | * | 10/1999 | Gardener | 257/330 |
| 5,972,758 A | | 10/1999 | Liang | 438/294 |
| 5,972,759 A | * | 10/1999 | Liang | 438/294 |
| 6,020,621 A | * | 2/2000 | Wu | 257/506 |

* cited by examiner

*Primary Examiner*—Mary Wilczewski
(74) *Attorney, Agent, or Firm*—Fulbright & Jaworski, L.L.P.

(57) ABSTRACT

A MOS transistor that includes: a semiconductor substrate; a well region formed in the semiconductor substrate, where a trench region is defined in the well region; an isolator formed on a corner of the trench region, where the trench region is filled with polysilicon; a gate conductor formed over the trench region; and source/drain regions formed within the well region laterally aligned to the gate conductor. A suitable method to form the MOS transistor includes the acts of: forming a well region in a semiconductor substrate; forming a trench region in the well region; forming an isolator in a corner of the trench region; filling the trench region with polysilicon; forming a gate conductor formed over the trench region; and forming source/drain regions within the well region on opposite sides of the gate conductor.

16 Claims, 3 Drawing Sheets

MOS TRANSISTOR THAT INHIBITS PUNCHTHROUGH

CROSS REFERENCE TO RELATED APPLICATION

This application is a divisional of application Ser. No. 09/223,236, filed Dec. 30, 1998 now U.S. Pat. No. 6,200,841, entitled "A MOS Transistor That Inhibits Punchthrough And Method For Fabricating The Same.

BACKGROUND OF THE INVENTION

1. Field of the Invention

The present invention relates to a process for fabricating semiconductor devices, and more particularly, to a MOS transistor and a method for fabricating the same.

2. Description of the Related Art

FIG. 1 shows a conventional MOS transistor. The conventional MOS transistor includes a P or N-type semiconductor substrate 1, a well region 3 formed in the semiconductor substrate 1 doped with impurities having conductivity opposite to those doped in the substrate 1, and isolation regions 2 realized by forming openings in the semiconductor substrate 1 and filling the openings with an oxide material (e.g. silicon oxide).

Formed over a "channel portion" of the well region 3 are a gate oxide layer 4 and a polysilicon gate structure 5 (hereinafter "gate conductor" refers to both gate oxide layer 4 and a polysilicon gate structure 5 together). Oxide spacers 7 are formed along sidewalls of the gate oxide layer 4 and the gate structure 5. Formed in the well region 3 between the gate structure 5 and the isolation regions 2 are source/drain region 6 into which impurities having a conductivity opposite to that of the impurities doped into the well region 3, are shallowly doped.

Where a channel length, i.e., the spacing between the source and drain regions (item C of FIG. 1) of the above described MOS transistor is less than 2 $\mu$m, "short channel effects" such as punchthrough can occur. Punchthrough is associated with the merging of source and drain depletion layers, i.e., when the drain depletion layer extends across the substrate and reaches the source depletion layer, thereby causing a destructive conduction path or leakage current between the source and drain. A drain depletion layer forms and spreads as the voltage applied across the transistor from the drain to the source (hereinafter drain-source voltage $V_{DS}$) is increased. At a certain drain-source voltage $V_{DS}$ called the punchthrough voltage, the width of the drain depletion layer approaches the channel length, and the depletion regions meet, resulting in punchthrough. Punchthrough results in, e.g., a constant drain current for increasing drain voltages.

Therefore, what is needed is a method and apparatus for controlling punchthrough in semiconductor devices.

SUMMARY

An embodiment of the present invention includes a MOS transistor that includes: a semiconductor substrate; a well region formed in the semiconductor substrate, where a trench region is defined in the well region; an isolator formed on a corner of the trench region, where the trench region is filled with polysilicon; a gate conductor formed over the trench region; and source/drain regions formed within the well region laterally aligned to the gate conductor.

An embodiment of the present invention includes a method of forming a MOS transistor, including the acts of: forming a well region in a semiconductor substrate; forming a trench region in the well region; forming an isolator in a corner of the trench region; filling the trench region with polysilicon; forming a gate conductor formed over the trench region; and forming source/drain regions within the well region on opposite sides of the gate conductor.

Various embodiments of the present invention will be more fully understood in light of the following detailed description taken together with the accompanying drawings.

DETAILED DESCRIPTION

This application claims priority from South Korean patent applications, Nos. 97-78391 and 97-78392 both filed on Dec. 30, 1997, disclosures of which are incorporated herein by reference.

A method for making a MOS transistor in accordance with an embodiment of the present invention will be described with reference to FIGS. 2a to 2e. All dimensions and parameters herein are exemplary.

Figure 1:
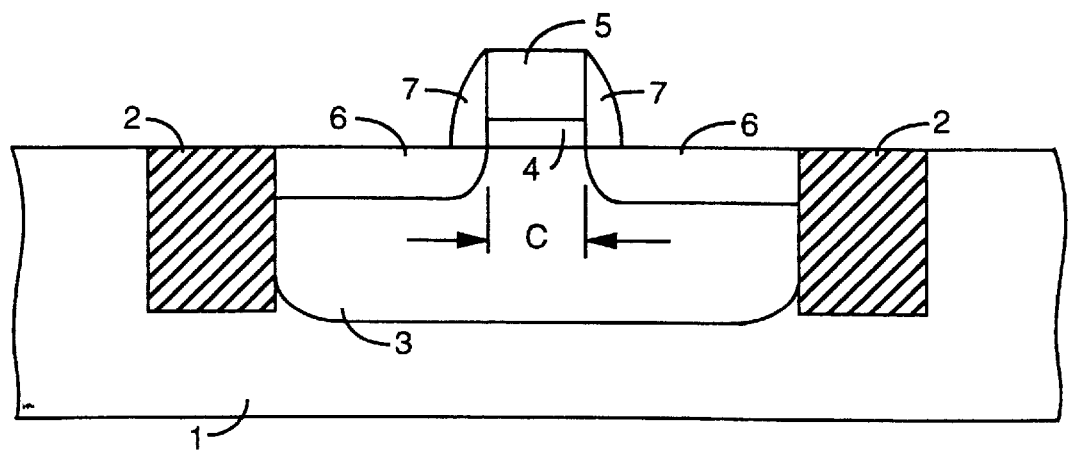
FIG. 1 is a cross-sectional view illustrating a conventional MOS transistor of the prior art.
Figure 2A:
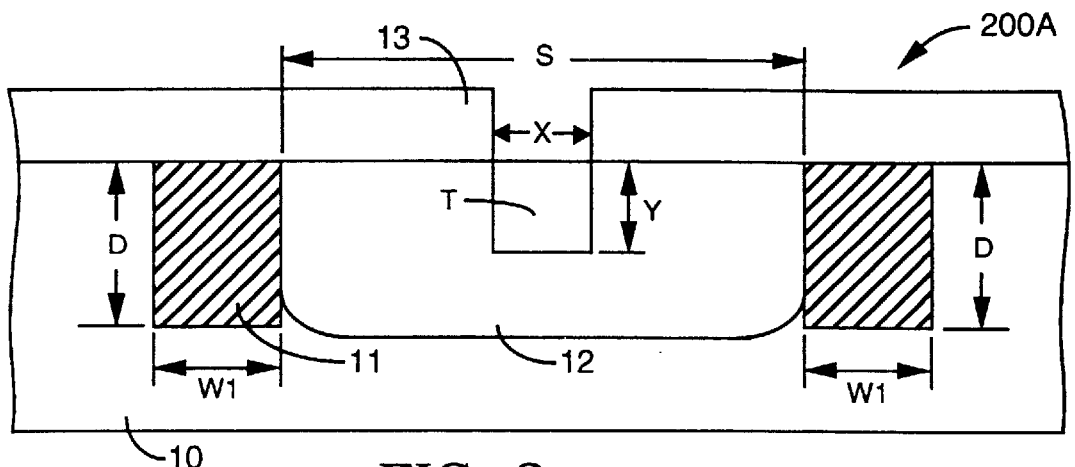
FIGS. 2a to 2e illustrate, in cross-section, a portion of a semiconductor device as it undergoes sequential processing steps for forming a MOS transistor in accordance with an embodiment of the present invention.

Referring to FIG. 2a, well region 12 is formed by implanting P or N-impurities into a semiconductor substrate 10 (e.g. polysilicon or monocrystalline). An exemplary dosage level, implant energy, and material to form well region 12 are respectively $1 \times 10^{13}$–$10 \times 10^{13}$ ions/cm$^2$, 500 keV–1 MeV, and charged phosphorous (P+) or charged boron (B+). Next, isolation regions 11 are formed in the substrate 10 to define a transistor area. An exemplary depth D and width W1 of isolation regions 11 are respectively approximately 3000–5000 Å and approximately 0.25–0.35 $\mu$m. The isolation regions 11 can be formed through a LOCOS method (localized oxidation of silicon) or a trench isolation method. Next, as shown in FIG. 2a, a photoresist pattern 13 is formed over the substrate 10.

Figure 2B:
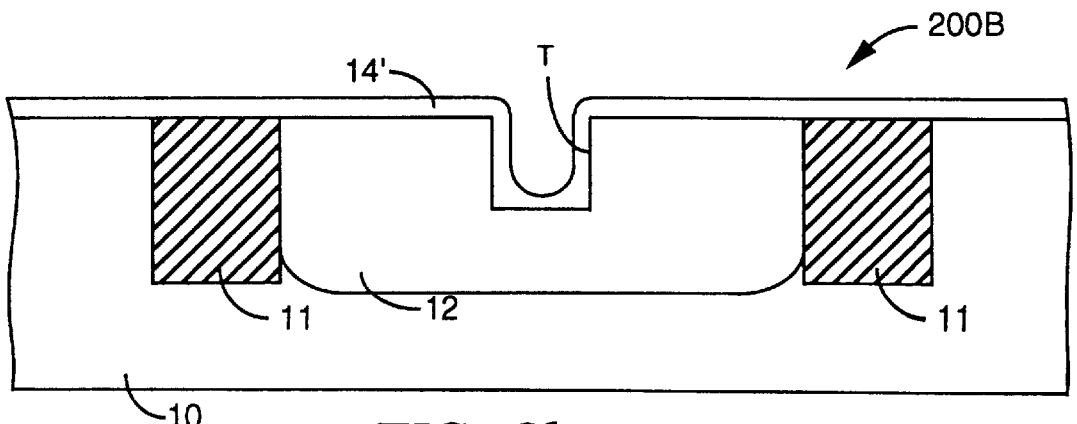

Next, the substrate 10 is etched using the photoresist pattern 13 as a mask such that a trench T is formed in the well region 12 (FIG. 2a). An exemplary depth Y and width X of the trench T are respectively approximately 2000–4000 Å and approximately 0.2–0.3 $\mu$m. After removing the photoresist pattern 13, an oxide layer 14' is formed over the substrate 10 and trench T using, e.g., an APCVD (atmospheric pressure chemical vapor deposition) method or an LPCVD (low-pressure chemical vapor deposition) method (FIG. 2b).

Figure 2C:
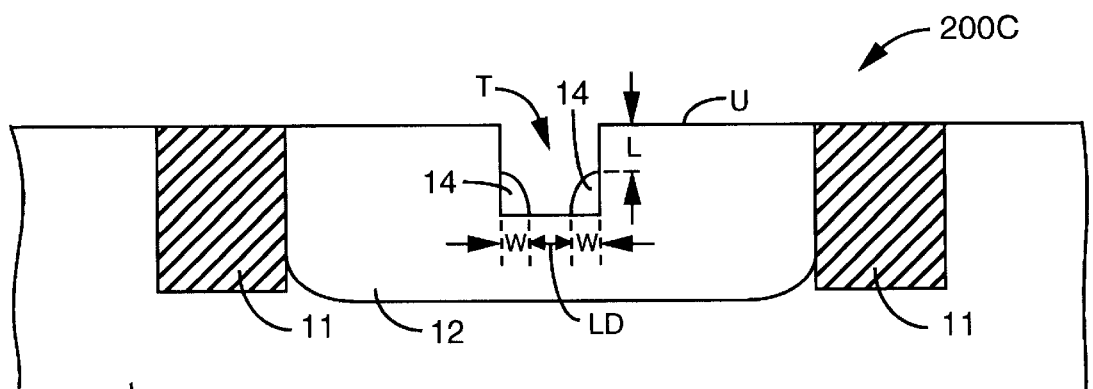

Next, second isolators 14 are formed on inner corners of the trench T by, e.g., anisotropically etching the oxide layer 14' (FIG. 2c). It is preferable that second isolators 14 are formed such that an upper side thereof reaches a depth L from upper substrate surface U. An exemplary depth L and width W of each second isolator 14 are respectively approximately 0.1–0.3 $\mu$m and approximately 0.5–1.5 $\mu$m. A lateral distance LD between second isolators 14 is approximately less than 0.1 $\mu$m.

Figure 2D:
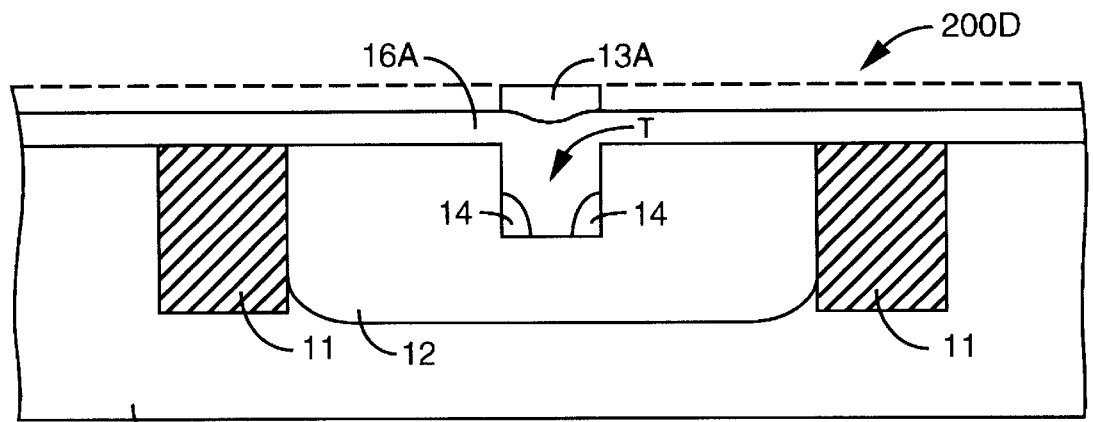

Next, as shown in FIG. 2d, a polysilicon layer 16A is formed over structure 200C of FIG. 2c, completely filling trench T. In another embodiment, a silicon-nitride or silicon-oxide layer may be formed over the substrate 10, before the polysilicon layer 16A is formed, to prevent the substrate from being damaged. Next, a photoresist pattern 13A is formed on a portion of the polysilicon layer 16A that covers trench T.

Figure 2E:
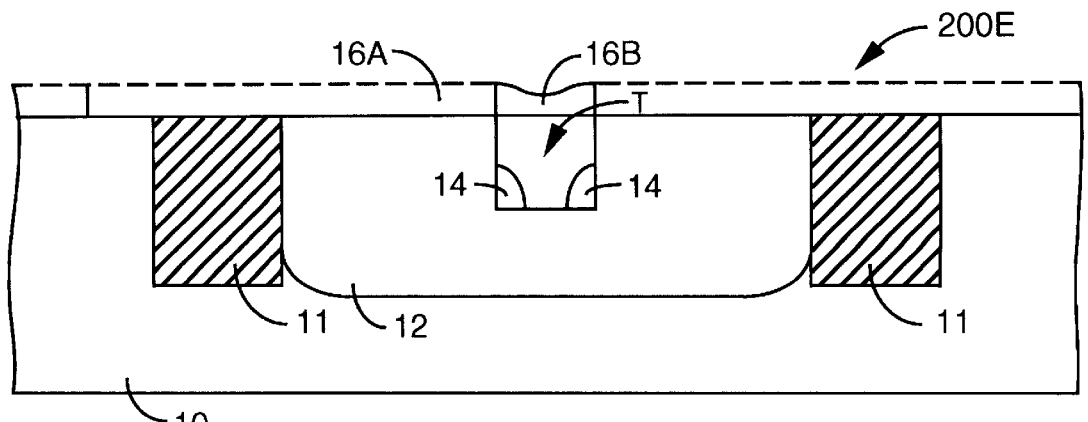

The polysilicon layer 16A is etched using the photoresist pattern 13A as a mask such that a polysilicon structure 16B remains on the substrate 10 (FIG. 2e). After removing the photoresist pattern 13A, the remaining polysilicon structure 16B protruding above the surface of the substrate 10 is removed by a conventional chemical mechanical polishing (CMP) process to flatten the surface of substrate. If isolation regions 11 are formed through a LOCOS process, isolation regions 11 can extend over the surface of the substrate 10, making the surface of the substrate uneven. The CMP process can thus remove any extending portion(s) of isolation regions 11 simultaneously with the removal of any protruding portion of the remaining polysilicon structure 16B thereby to flatten the surface of substrate.

Figure 3:
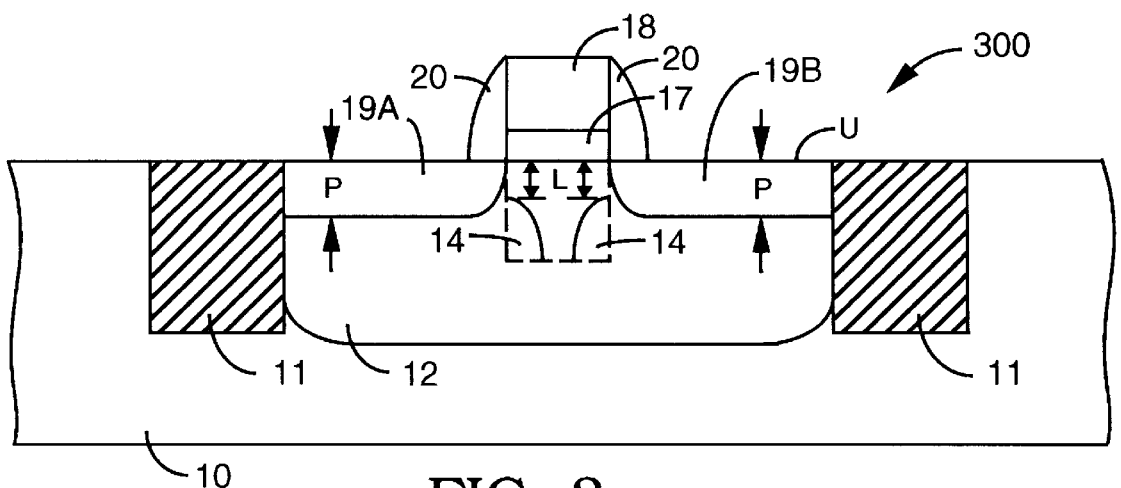
FIG. 3 depicts a cross-sectional view illustrating a MOS transistor in accordance with an embodiment of the present invention.

Referring to FIG. 3, next a gate oxide layer 17 and polysilicon gate structure 18 are each formed, in the listed order, using conventional methods that are well known to those skilled in the art of semiconductor fabrication (hereinafter the term "gate conductor" refers to gate oxide layer 17 and polysilicon gate structure 18 together). Exemplary heights of each of gate oxide layer 17 and polysilicon gate structure 18 are respectively approximately 25–40 Å and approximately 1500–2500 Å. In this embodiment, as depicted in FIG. 3, second isolators 14 are formed below gate conductor, i.e., vertically aligned with gate conductor and below upper substrate surface U.

Next, source/drain regions 19 are formed to be laterally aligned to the gate conductor by shallowly implanting impurities having a conductivity opposite to that of those doped in the well 12. An exemplary dosage level, implant energy, and material to form source and drain regions 19A and 19B are respectively $1\times10^{15}$–$1\times10^{18}$ ions/cm$^2$, 5–25 keV, and phosphorous (P), arsenic (As), boron (B), or boron triflouride ions (BF$_2$). Source and drain regions 19A and 19B are each formed to a depth P. Note that the depth L of the upper side of second isolators 14 is closer to the upper substrate surface U than the depth P of source and drain regions 19A and 19B.

Next insulative sidewall spacers 20 are formed using conventional methods that are well known to those skilled in the art of semiconductor fabrication. An exemplary width of each of sidewall spacers 20 is approximately 800–1500 Å. FIG. 3 depicts the resulting MOS transistor 300 in accordance with an embodiment of the present invention.

Figure 4:
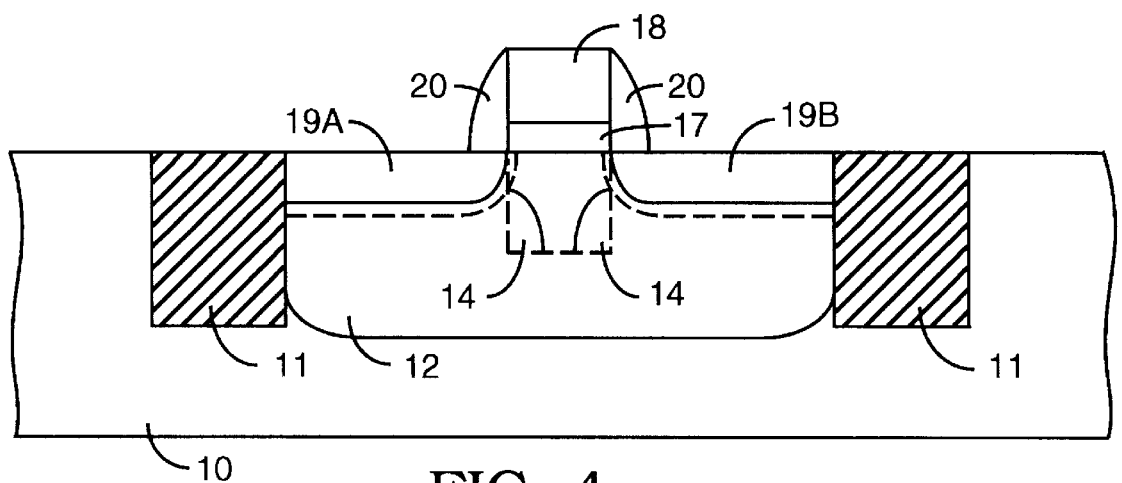
FIG. 4 depicts a cross-sectional view illustrating a MOS transistor in accordance with an embodiment of the present invention with depletion regions.

Referring to FIG. 4, for example, where a voltage V is applied between source/drain regions 19A and 19B, depletion regions, shown in broken lines, form around source/drain regions 19A and 19B. Advantageously, second isolators 14 inhibit the expansion of depletion regions about the source/drain regions 19A and 19B to inhibit formation of a conduction path or leakage current between the regions 19A and 19B, thereby increasing the voltage between the regions 19A and 19B required to achieve punchthrough. Second isolators 14 further inhibit hot-carrier injection between the regions 19A and 19B.

The above-described embodiments are illustrative and not limiting. It will thus be obvious to those skilled in the art that various changes and modifications may be made without departing from this invention in its broader aspects. Therefore, the appended claims encompass all such changes and modifications as fall within the scope of this invention.

What is claimed is:

1. A MOS transistor having a semiconductor substrate, comprising:
   a transistor area defined by a first isolation area formed in the semiconductor substrate, the semiconductor substrate having an upper surface;
   a gate oxide layer formed over the transistor area;
   a gate conductor formed over the gate oxide layer, wherein the gate conductor defines a channel region;
   a source and a drain; and
   a second isolator formed in the substrate between the source and the drain and below the upper surface of the semiconductor substrate, the gate oxide layer and the gate conductor;
   wherein the second isolator does not extend to the upper surface of the semiconductor substrate.

2. The MOS transistor of claim 1 wherein the second isolator is formed in the substrate so that its upper side is closer to the upper surface than a depth of the source/drain region.

3. The MOS transistor of claim 1 wherein when a voltage is applied across the source and the drain, a depletion region is formed at a bottom surface of each of the source and the drain and extends into the semiconductor substrate, the second isolator inhibiting the depletion region from expanding beyond a topmost surface of the second isolator.

4. A MOS transistor comprising:
   a semiconductor substrate having an upper surface;
   a well region formed in the semiconductor substrate, wherein a trench is defined in the well region, the trench having a top surface located at the upper surface of the semiconductor substrate;
   an isolator formed on a corner of the trench region, wherein the trench is filled to the top surface with polysilicon;
   a gate conductor formed over the top surface of the trench; and
   a source and a drain formed within the well region laterally aligned to the gate conductor.

5. The MOS transistor of claim 4 wherein the isolator is formed in the substrate so that its upper side is closer to an upper surface of the semiconductor substrate than a depth of the source and the drain.

6. The MOS transistor of claim 4 wherein when a voltage is applied across the source and the drain, a depletion region is formed at a bottom surface of each of the source and the drain and extends into the semiconductor substrate, the isolator inhibiting the depletion region from expanding beyond a topmost surface of the isolator.

7. The MOS transistor of claim 4 wherein the source and the drain region have a depth in the semiconductor substrate that extends below a topmost surface of said isolator.

8. The MOS transistor of claim 4, wherein the isolator does not extend to the top surface of the trench.

9. A MOS transistor having a semiconductor substrate comprising:
   a transistor area formed in a trench region of the semiconductor substrate, the semiconductor substrate having an upper surface, the trench having a bottom surface, a top surface, and corners at the bottom surface;
   a gate conductor above the trench region and the upper surface of the semiconductor substrate, wherein the gate conductor defines a channel region;

source and drain regions, the trench region located in the channel region and between the source and drain regions; and isolating regions located in the corners of the trench region, wherein the trench region is filled with polysilicon, and the isolating regions do not extend to the top surface of the trench.

10. The MOS transistor of claim 9 wherein when a voltage is applied across the source region and the drain region, a depletion region is formed at a bottom surface of each of the source and drain regions and extends into the semiconductor substrate, the isolating regions inhibiting the depletion region from expanding beyond a topmost surface of the isolating regions.

11. The MOS transistor of claim 9 wherein the source and the drain have a depth in the semiconductor substrate that extends below a topmost surface of said isolator.

12. A MOS transistor comprising:

a semiconductor substrate having an upper surface;

a trench in the semiconductor substrate between a source and a drain, said trench having a top surface, a bottom surface, a corner at the bottom surface, a sidewall, and a depth below the top surface, the top surface of the trench located at the upper surface of the semiconductor substrate;

an isolator formed on each bottom corner of the trench, each isolator having a height from the bottom surface of the trench, the height of each isolator less than the depth of the trench, wherein the trench is filled with polysilicon;

a gate conductor formed above the top surface of the trench and the upper surface of the substrate.

13. The MOS transistor of claim 12 wherein a portion of the isolator is located below at least a portion of a depletion region formed at a bottom surface of each of the source and the drain when a voltage is applied across the source and the drain, the isolator inhibiting the depletion region from expanding beyond a topmost surface of the isolator.

14. A MOS transistor having a semiconductor substrate comprising:

a transistor area formed in a trench region of the semiconductor substrate, the semiconductor substrate having an upper surface, the trench having a bottom surface, a top surface, and corners at the bottom surface, the top surface of the trench located at the upper surface of the semiconductor substrate;

a gate conductor above the trench region and the upper surface of the semiconductor substrate, wherein the gate conductor defines a channel region;

source and drain regions, the trench region located in the channel region and between the source and drain regions; and isolating regions located in the corners of the trench region, wherein the trench region is filled to the top surface with polysilicon and the isolating regions do not extend to the top surface of the trench.

15. The MOS transistor of claim 14 wherein the isolating regions are formed in the substrate so that an upper side of the isolating regions is closer to the upper surface of the substrate than a depth of the source and drain regions.

16. The MOS transistor of claim 14 wherein the source and the drain have a depth in the semiconductor substrate that extends below a topmost surface of said isolator.

* * * * *